(12) United States Patent
Breuer et al.

(10) Patent No.: US 7,965,080 B2
(45) Date of Patent: Jun. 21, 2011

(54) ELECTRO-CONDUCTIVE PET PHANTOM FOR MR/PET QUALITY CONTROL MEASUREMENT

(75) Inventors: Johannes Breuer, Dortmund (DE); A. Andrew Carey, Lenoir City, TN (US); Xinli Liu, Knoxville, TN (US); Volker Matschl, Bamberg (DE); Rainer Paul, Bad Bergzabern (DE)

(73) Assignee: Siemens Medical Solutions USA, Inc., Malvern, PA (US)

( * ) Notice: Subject to any disclaimer, the term of this patent is extended or adjusted under 35 U.S.C. 154(b) by 164 days.

(21) Appl. No.: 12/560,027

(22) Filed: Sep. 15, 2009

(65) Prior Publication Data

US 2010/0066372 A1    Mar. 18, 2010

Related U.S. Application Data

(60) Provisional application No. 61/098,001, filed on Sep. 18, 2008.

(51) Int. Cl.
*G01V 3/00* (2006.01)

(52) U.S. Cl. .................................... 324/317; 324/318

(58) Field of Classification Search ................... 324/317, 324/318, 321; 600/414
See application file for complete search history.

(56) References Cited

U.S. PATENT DOCUMENTS

| | | | | |
|---|---|---|---|---|
| 5,469,847 A * | 11/1995 | Zinreich et al. | ............... | 600/414 |
| 7,439,493 B2 * | 10/2008 | Teppaz et al. | ............... | 250/252.1 |
| 7,518,363 B2 * | 4/2009 | Gortler et al. | ................. | 324/307 |
| 7,675,028 B2 * | 3/2010 | Breuer et al. | ............... | 250/252.1 |
| 7,702,378 B2 * | 4/2010 | Bolan et al. | ................... | 600/414 |
| 2010/0198063 A1 * | 8/2010 | Huber et al. | ................... | 600/437 |
| 2010/0202001 A1 * | 8/2010 | Miller et al. | .................... | 358/1.9 |

* cited by examiner

*Primary Examiner* — Louis M Arana
(74) *Attorney, Agent, or Firm* — Peter L. Kendall

(57) ABSTRACT

A phantom for use in quality control measurement of a fully integrated magnetic resonance/PET scanner is disclosed. The phantom features radiation activity distributed throughout an electrically conductive binder. Suitably, the binder is elastomeric and includes carbon fibers distributed throughout it to set the conductivity of the phantom to a desired level. The phantom is applicable to various multimodality integrated medical imaging systems such as MR/SPECT and MR/CT in addition to MR/PET.

30 Claims, 3 Drawing Sheets

ELECTRO-CONDUCTIVE PET PHANTOM FOR MR/PET QUALITY CONTROL MEASUREMENT

TECHNICAL FIELD

In general, the invention relates to nuclear medicine. More particularly, the invention relates to phantoms used for quality control measurement of nuclear medical imaging devices.

BACKGROUND

In general, a phantom is used to calibrate and/or verify the accuracy of nuclear medical imaging devices such as PET scanners. In essence, a phantom is a body with known shape and uniform distribution of radiation activity throughout the body. Thus, by imaging the phantom with its known geometry and radiation distribution, the accuracy of the software used to assemble the various tomographic slices acquired by the imaging apparatus into three-dimensional representations of a patient's region of interest can be assessed and, if necessary, the various apparatus settings can be adjusted. More specifically, imaging a phantom with uniform distribution of radioactivity allows a set of calibration coefficients to be developed to compensate for non-uniformity of the scintillation materials and/or detector components in the PET scanner.

Recently, a fully integrated magnetic resonance/PET scanner has been developed, which integrated scanner allows for simultaneous MR and PET imaging (see, e.g., U.S. Pub. No. 2007/0055127, published Mar. 8, 2007 and incorporated herein by reference). Such a scanner requires a dedicated phantom which, in addition to facilitating quality control assessment of the PET scanning functionality of the machine, facilitates a determination of the extent to which operating the MR functionality of the machine influences the PET signals acquired by the machine. A conventional phantom will not work for this purpose because the MR coil of the scanner has to experience a certain load in order to dampen the resonance peak sufficiently, even when maximum RF power is applied to the coil. Otherwise, if the MR coil is not loaded when maximum RF power is applied, too much current will be developed in the MR resonance circuit, and that current could potentially be high enough to destroy the MR coil itself.

SUMMARY

Embodiments of the invention provide a phantom for use in quality control measurement of a fully integrated magnetic resonance/PET scanner. The phantom features radiation activity distributed throughout an electrically conductive binder. Suitably, the binder is elastomeric and includes electrically conducting fibers distributed throughout it to set the conductivity of the phantom to a desired level.

In a first aspect, the invention features a phantom that includes an electrically conductive matrix with radiation activity distributed uniformly throughout the matrix. In various embodiments, the electrically conductive matrix may comprise an ether-based thermoplastic polyurethane elastomeric material, suitably with electrically conductive dopant (such as carbon, aluminum, copper, or semiconducting polymer (e.g., polyacetylene-based) fibers) distributed throughout it. The matrix may have a specific gravity of about 1 g/cm$^3$ and an electrical resistivity of about 10 to about 200 Ωcm. The phantom may have distributed radiation activity of about 1.5 mCi or less that is suitably provided by Ge$^{68}$.

In another aspect, the invention features a method for quality control testing an integrated MR/PET scanner. The method includes placing a phantom in the scanner, which phantom is constructed as per the first aspect of the invention; operating MR features of the scanner; and simultaneously imaging the phantom using the PET features of the scanner.

BRIEF DESCRIPTION OF THE DRAWINGS

Exemplary embodiments of the invention will now be described in greater detail with reference to the attached drawings, in which.

DETAILED DESCRIPTION

Figure 1:
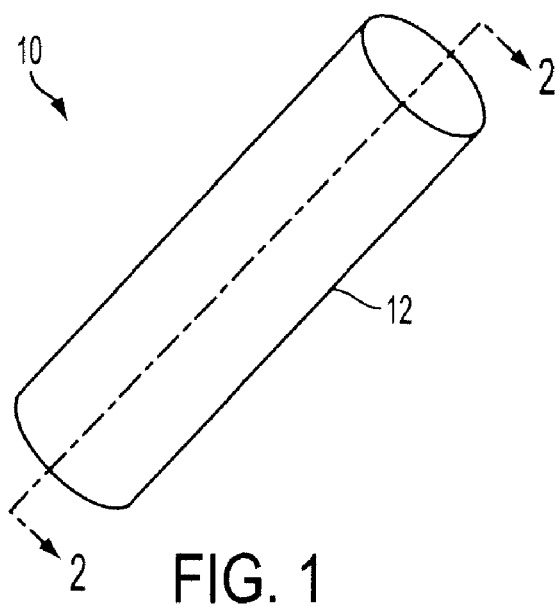
FIG. 1 is schematic perspective view of an embodiment of a phantom according to the invention.
Figure 2:
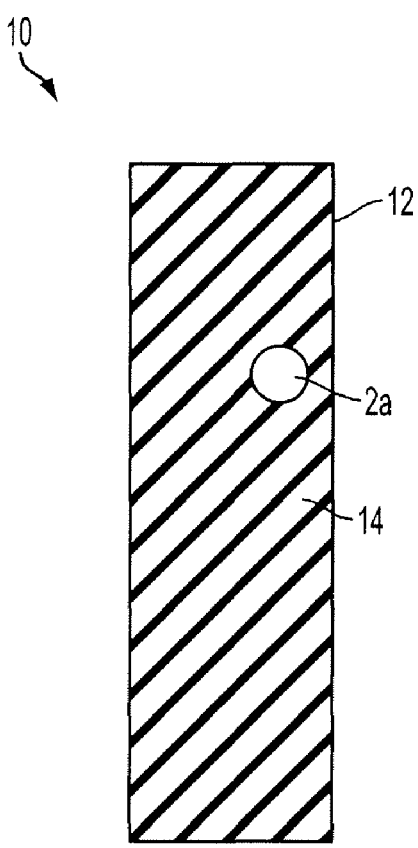
FIG. 2 is a schematic section view of the embodiment of a phantom shown in FIG. 1 taken along lines 2-2 therein.
Figure 2A:
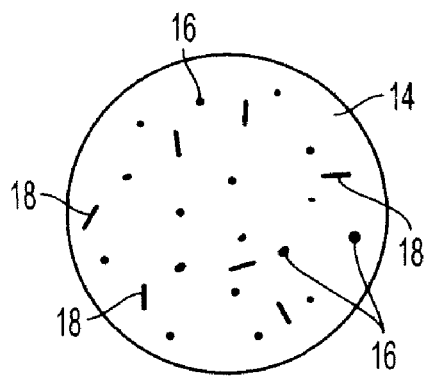
FIG. 2a is a close-up view of a portion of the phantom shown in FIG. 2.

An embodiment 10 of a phantom according to the invention is illustrated in FIGS. 1, 2, and 2a. The phantom 10 is suitably cylindrical in shape and is in the order of 20 centimeters long. It should be appreciated by those skilled in the art that other sizes can be used without departing from the scope of the invention. The phantom 10 has a sealed casing 12 made from suitable radio-transmissive material, such as is known in the art.

The casing 12 is filled with an electrically conductive matrix 14, which has radiation activity (indicated schematically as dots 16) distributed uniformly throughout it. For example, the radiation activity may be provided by Ge$^{68}$ distributed uniformly throughout the matrix in an amount sufficient to provide a radiation activity on the order of 1.5 mCi or less.

Figure 3:
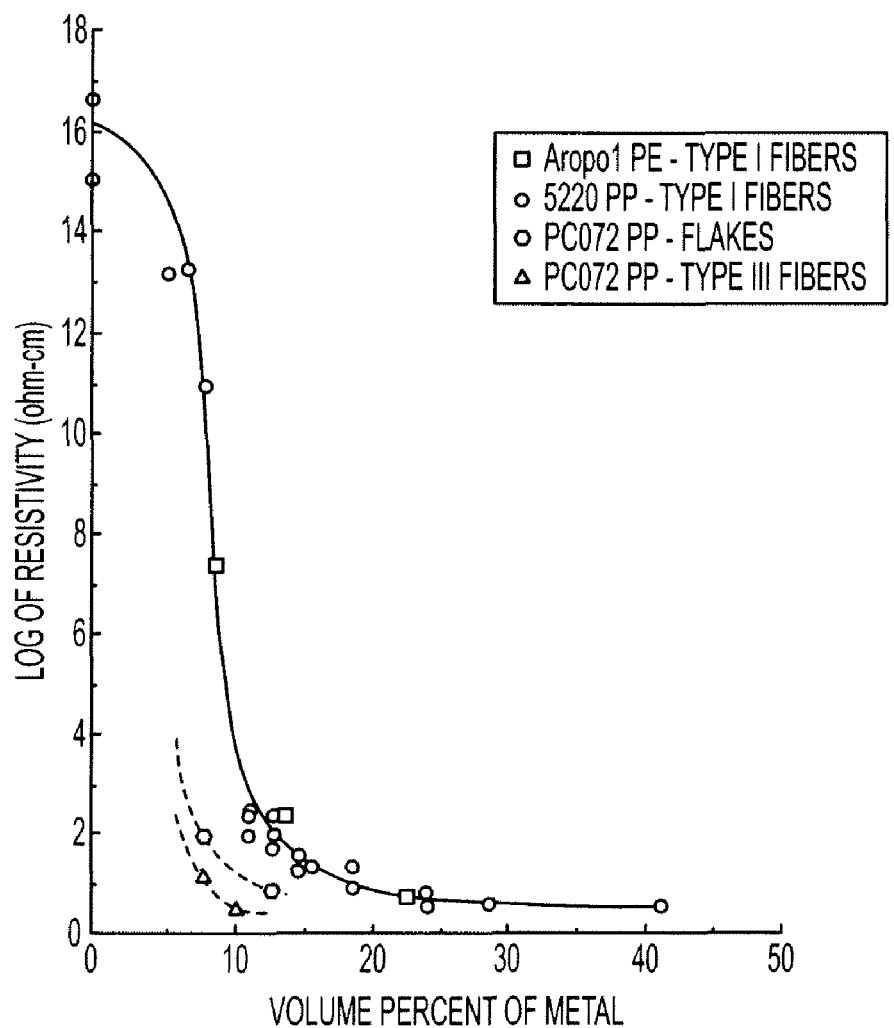
FIG. 3 is a graph, taken from Polymer Engineering and Science, December 1979, Vol. 19 No. 16, showing volume resistivity of composite materials versus volume loading of metal particles.

A suitable electrically conductive base material from which to fabricate the matrix 14 is an ether-based thermoplastic polyurethane elastomer. Preferably, the base material has a specific gravity of approximately 1 g/cm$^3$ (i.e., approximately equal to the specific gravity of water) and an electrical resistivity of between about 10 and about 200 Ωcm. Furthermore, depending on the specific base material utilized, the desired overall conductivity/resistivity could be realized by distributing carbon fibers 18 throughout the material, since the resistivity of the composite material will vary with the volumetric ratio of elastomer to carbon fiber as illustrated in FIG. 3. Other fibers that could be used include aluminum, titanium, copper, or semiconducting polymer (e.g., polyacetylene-based) fibers.

In tests, the MR usability of a phantom constructed as described above was verified. In particular, it was demonstrated that a phantom as per embodiments of the invention could present the same electrical load as a 2 l MR-standard water-based phantom with NaCl solution contained therein. More particularly, the Q factor (quality factor) of a given resonant circuit—15 cm in diameter and tuned at 123 MHz—was measured, since Q is one indicator for the load on a circuit. (Q is defined as $$Q = \frac{1}{R}\sqrt{\frac{L}{C}},$$

where R, L, and C are the resistance, inductance, and capacitance of a tuned circuit.) The Q value was determined using a network analyzer once the phantom was placed in the center of the resonance circuit. The unloaded loop had a Q value of about 200. The circuit loaded with a standard 2 l water-based phantom exhibited a Q value of 30. The circuit loaded with one phantom as described above and mixed with 0.5% by volume of carbon fiber content had a Q value of 18; the circuit loaded with another phantom as described above and mixed with 1.0% by volume of carbon fiber content had a Q value of 80. Thus, these results and the graph shown in FIG. 3 make clear that a Q value of 30—i.e., the Q value associated with a standard 2 l water-based, NaCl solution-containing phantom—could be obtained with a phantom as per the invention.

Figure 4:
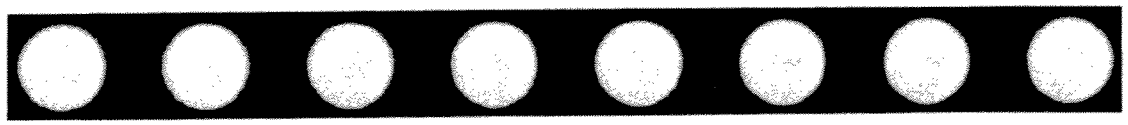
FIG. 4 is a PET scan showing homogenous distribution of activity within a phantom according to an embodiment of the invention.

Furthermore, the PET usability of phantoms as per embodiments of the invention was verified by subjecting them to PET scans, results of which are shown in FIG. 4. In particular, FIG. 4 illustrates homogenous distribution of radiation activity within the phantom.

Attenuation or scattering of the phantom will not be affected due to the relatively low contingent of carbon fibers in the phantom. The carbon fiber specific gravity of 1.8 g/cm$^3$ is similar to that of the surrounding elastomer, which is about 1.1 g/cm$^3$. Furthermore, the atomic number of carbon is only 6, which is very low compared to other materials that could be used as conductive dopant.

Given the above, a phantom as per embodiments of the invention can be used to verify the accuracy of an integrated MR/PET scanner by placing the phantom within the scanner, running the MR features of the scanner at full RF power, and conducting a PET scan of the phantom at the same time. The PET signals/images would then be analyzed to verify their accuracy. Thus, a phantom as per embodiments of the invention eliminates the need for a separate water-based (NaCl solution) phantom doped with FDG, and the hazards associated with such prior art phantoms can be eliminated.

While the invention has been disclosed with reference to specific exemplary embodiments, modifications to and departures from the disclosed embodiments will occur to those having skill in the art. For example, while the invention has been described with reference to an integrated MR/PET system, the phantom also could be applicable to other integrated multimodality systems such as MR/SPECT and MR/CT. Accordingly, what is protected is defined by the scope of the following claims.

What is claimed is:

1. A phantom for use in quality control measurement of a multimodality integrated medical imaging scanner wherein magnetic resonance constitutes one of said modalities, said phantom comprising an electrically conductive matrix with radiation activity distributed uniformly throughout the matrix.

2. The phantom of claim 1, wherein said electrically conductive matrix comprises an ether-based thermoplastic polyurethane elastomeric material.

3. The phantom of claim 1, wherein the matrix has electrically conductive dopant distributed throughout it.

4. The phantom of claim 3, wherein said electrically conductive dopant comprises fibers.

5. The phantom of claim 3, wherein said fibers comprise carbon fibers.

6. The phantom of claim 3, wherein said fibers comprise aluminum fibers.

7. The phantom of claim 3, wherein said fibers comprise copper fibers.

8. The phantom of claim 3, wherein said fibers comprise titanium fibers.

9. The phantom of claim 3, wherein said fibers comprise semiconducting polymer-based fibers.

10. The phantom of claim 9, wherein said fibers are polyacetylene-based.

11. The phantom of claim 1, wherein said electrically conductive matrix has a specific gravity of about 1 g/cm$^3$.

12. The phantom of claim 1, wherein said electrically conductive matrix has an electrical resistivity of about 10 to about 200 Ωcm.

13. The phantom of claim 1, wherein said phantom has distributed radiation activity of about 1.5 mCi or less.

14. The phantom of claim 1, wherein the radiation activity is provided by Ge$^{68}$.

15. The phantom of claim 1, wherein PET constitutes a second of said modalities.

16. A method of quality control testing an integrated multimodality medical imaging scanner, wherein magnetic resonance constitutes one of said modalities, comprising:
 disposing a phantom within the scanner, the phantom comprising an electrically conductive matrix with radiation activity distributed uniformly throughout the matrix;
 operating magnetic resonance imaging features of the scanner; and
 simultaneously imaging the phantom using a second modality imaging feature of the scanner.

17. The method of claim 16, wherein said electrically conductive matrix comprises an ether-based thermoplastic polyurethane elastomeric material.

18. The method of claim 16, wherein the matrix has electrically conductive dopant distributed throughout it.

19. The method of claim 18, wherein said electrically conductive dopant comprises fibers.

20. The method of claim 19, wherein said fibers comprise carbon fibers.

21. The method of claim 19, wherein said fibers comprise aluminum fibers.

22. The method of claim 19, wherein said fibers comprise copper fibers.

23. The method of claim 19, wherein said fibers comprise titanium fibers.

24. The method of claim 19, wherein said fibers comprise semiconducting polymer-based fibers.

25. The phantom of claim 24, wherein said fibers are polyacetylene-based.

26. The method of claim 16, wherein said electrically conductive matrix has a specific gravity of about 1 g/cm$^3$.

27. The method of claim 16, wherein said electrically conductive matrix has an electrical resistivity of about 10 to about 200 Ωcm.

28. The method of claim 16, wherein said phantom has distributed radiation activity of about 1.5 mCi or less.

29. The method of claim 16, wherein the radiation activity is provided by Ge$^{68}$.

30. The method of claim 16, wherein PET constitutes a second of said modalities.

* * * * *